United States Patent
Shiau et al.

[11] Patent Number: 5,985,363
[45] Date of Patent: *Nov. 16, 1999

[54] METHOD OF PROVIDING UNIFORM PHOTORESIST COATINGS FOR TIGHT CONTROL OF IMAGE DIMENSIONS

[75] Inventors: Gwo-Yuh Shiau, Hsinchu; Shinn-Jhy Lian, Lyu-Ying; Daniel Hao-Tien Lee, Hsinchu; Li-Ming Wang, Chechang-Shiang; Hsiang-Wei Tseng, Taichung, all of Taiwan

[73] Assignee: Vanguard International Semiconductor, Hsin-chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/814,129

[22] Filed: Mar. 10, 1997

[51] Int. Cl.$^6$ .............. B05D 3/12; B05D 3/02; H01L 21/31
[52] U.S. Cl. .............. 427/240; 427/314; 427/407.1; 427/337; 427/384; 438/761; 438/782
[58] Field of Search .............. 427/240, 314, 427/372.2, 407.1, 337, 384; 438/761, 782

[56] References Cited

U.S. PATENT DOCUMENTS

| | | | |
|---|---|---|---|
| 4,022,927 | 5/1977 | Pfeiffer et al. | 427/43 |
| 4,113,492 | 9/1978 | Sato et al. | 96/67 |
| 4,267,212 | 5/1981 | Sakawaki | 427/240 |
| 4,741,926 | 5/1988 | White et al. | 427/240 |
| 4,748,053 | 5/1988 | Okada | 427/240 |
| 4,850,381 | 7/1989 | Moe et al. | 134/62 |
| 4,886,728 | 12/1989 | Salamy et al. | 430/331 |
| 5,066,616 | 11/1991 | Gordon | 437/229 |
| 5,122,439 | 6/1992 | Miersch et al. | 430/311 |
| 5,344,748 | 9/1994 | Feely | 430/330 |
| 5,346,799 | 9/1994 | Jeffries, III et al. | 430/192 |
| 5,395,803 | 3/1995 | Adams | 437/229 |
| 5,405,813 | 4/1995 | Rodriques | 437/231 |
| 5,444,921 | 8/1995 | Milina | 33/833 |
| 5,608,943 | 3/1997 | Konishi et al. | 15/302 |

*Primary Examiner*—Shrive Beck
*Assistant Examiner*—Michael Barr
*Attorney, Agent, or Firm*—George O. Saile; Stephen B. Ackerman

[57] ABSTRACT

A method for providing a uniform coating of photoresist over substrate for defining high density integrated device and circuit patterns. This is accomplished by applying the photoresist onto the substrate in multiple, separate dispensing steps and leveling spins to attain the designed thickness uniformly over substrate having high topographic surfaces, thereby preserve the integrity of the critical dimension for multi-level alignments used in the fabrication of integrated devices and circuits.

21 Claims, 3 Drawing Sheets

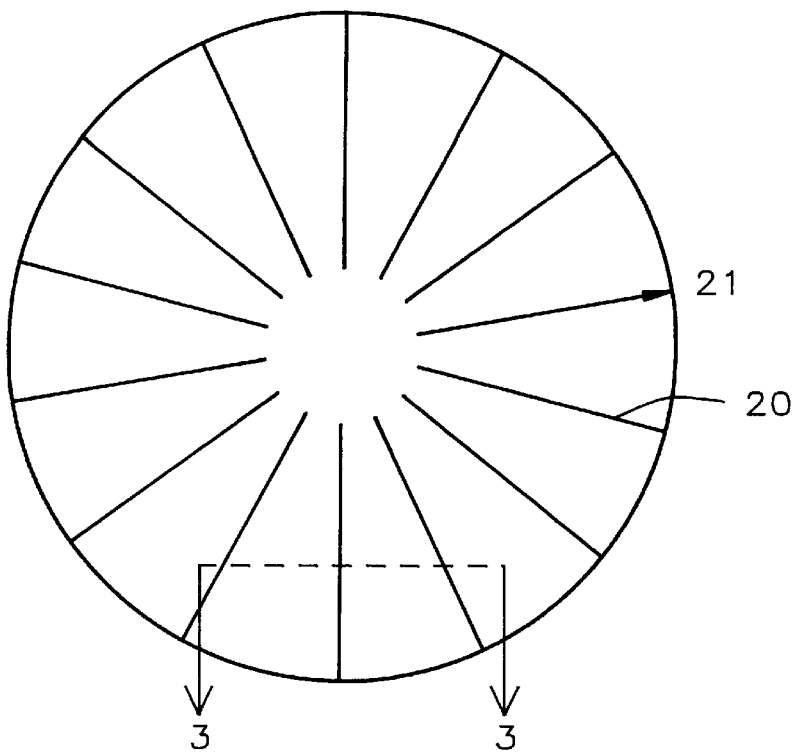
FIG. 1 – Prior Art
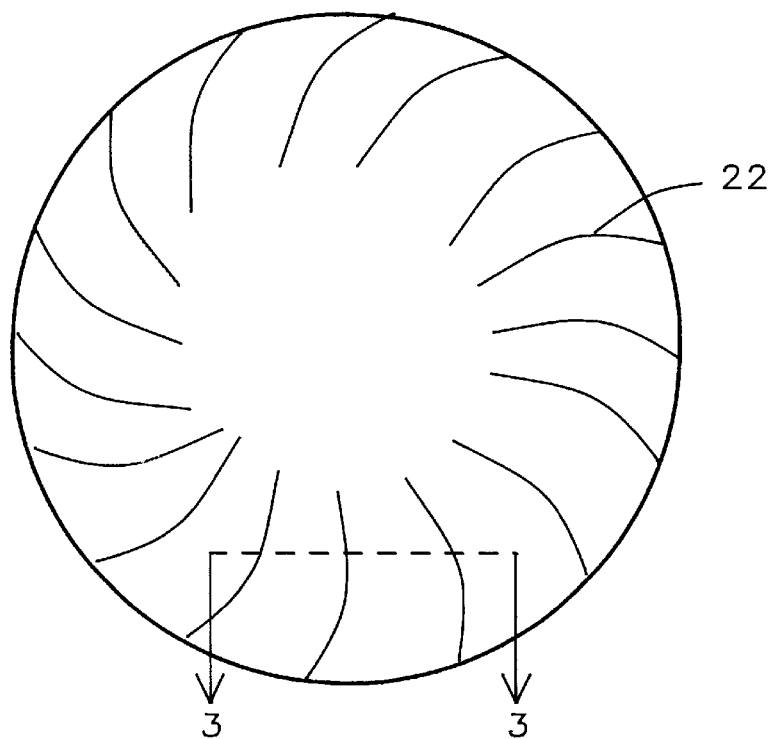
FIG. 2 – Prior Art

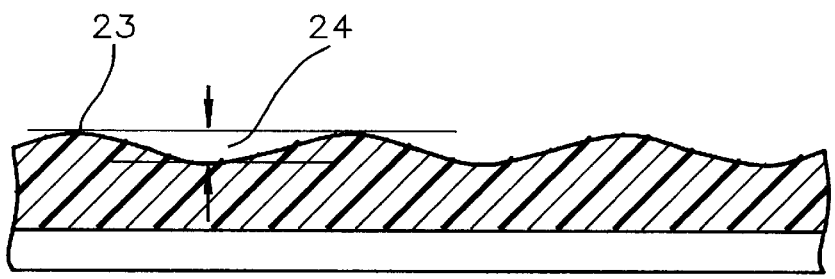
*FIG. 3 - Prior Art*
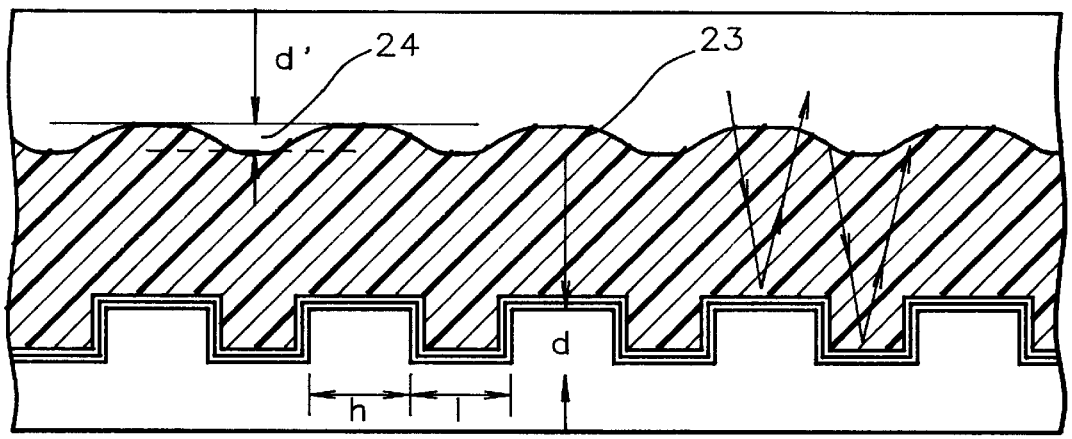
*FIG. 4*

Experimental results of Striation improvement of topography wafer with 0.8μm step-height

| Photoresist dispense method | Striation for 1.6μm photoresist |
|---|---|
| Conventional single-dispense | 1150 Angstroms |
| Modified single-dispense | 450 Angstroms |
| Double-dispense | 300 Angstroms |

FIG. 5

METHOD OF PROVIDING UNIFORM PHOTORESIST COATINGS FOR TIGHT CONTROL OF IMAGE DIMENSIONS

FIELD OF THE INVENTION

This invention relates to methods used to minimizing the non-uniformity of the thickness of the spin-on photoresist resulting from surface topographic variation in a semiconductor device wafer.

DESCRIPTION OF PRIOR ART

The photolithographic process is one of the key processing steps used extensively in the fabrication of the semiconductor devices and integrated circuits. Conventional application of photolithographic technique consists of placing the wafer device-side up onto a circular, flat disk vacuum chuck turntable in a chamber. The diameter of the circular disk is usually smaller than that of the wafer. Next, the top surface of the wafer is cleaned by a volatile liquid solvent, which may contain a bonding agent to enhance the adhesion of the subsequent spin-on photoresist layer. Afterwards, the excess solvent is spun off and the spinning continues until the wafer appears dry. A predetermined amount of photoresist liquid is dispensed onto the center of the top surface of the wafer. Resume the spinning of the wafer on the turntable until the photoresist is spread over the entire top surface of the wafer. After the photoresist is dried, it is exposed using either a mask or direct writing method to form the pattern of the design of one layer of the integrated circuits. Even with careful control and monitoring of the physical, and chemical composition of the surface of the wafer and the photoresist, problems related to the uniformity of the photoresist still arise from the application of the photoresist onto the wafers having surface topographical variations, in particular, the presence of mottling due to the uneven coating of photoresist over the top surface of the wafer having high density devices or circuits and the different affinities of the photoresists to various materials, such as bare silicon, oxide, nitride, etc. on the surface of the wafers.

William G. Gordon, in U.S. Pat. No. 5,066,616, has described a process claiming to provide a reliable and uniform photoresist coating over the wafer with high density and high topography circuit designs which are specially prone to mottling. His invention teaches the technique of leaving a predetermined amount of liquid solvent on the wafer surface when the liquid photoresist is dispensed onto the center of the wafer. However, it is extremely difficult to monitor the optimal amount of the liquid solvent that is required to be left on the surface of the wafer. If too much solvent is left on the surface the photoresist may not consistently cover the substrate surface, and if insufficient amount of solvent remains on the surface of the subsrate, mottling will appear.

Thomas F. Adams, in U.S. Pat. No. 5,395,803 has described a method for overcoming the non-uniformity of photoresist coating by dispensing the photoresist from the edge of the wafer, instead of the center of the wafer as done in conventional method, and continuing the dispensing the photoresist inwardly in a spiral pattern according to a programmed rate of volume of photoresist per unit area traversed, then retracing the dispensing spiral pattern and stopping the dispensing at the edge or beyond the edge of the wafer, thus avoiding termination of dispensation of photoresist in the center which invariably produces drops of uneven volume than the separation from the continuous flow.

Michael A. Rodrigues, in U.S. Pat. No. 5,405,813 claimed that by varying the rotating speeds of the turntable during the dispensation of photoreist and the drying step, he was able to produce a layer photoresist of uniform thickness over the top surface of a semiconductor wafer while simultaneously reducing the amount of photoresist material used in the coating process.

This invention will describe a process in which dispensing of the photoresist is performed in separate, multiple steps. In addition, leveling procedure is introduced in between the multiple dispensing steps to further enhance the uniformity of the resist over the surface of the semiconductor wafer having high density and high topography circuit designs. The mottlings and striations resulted in the photoresist dispensed by the conventional method thus eliminated.

SUMMARY OF THE INVENTION

It is therefore an object of the present invention to provide a process or method to improve the application of photoresist to the surface of a substrate in the fabrication of integrated circuits.

It is another object of this invention to achieve tight control of the critical dimension of the design of the integrated circuit by improving the uniformity of the photoresist dispensed over the top surface of substrate with high density circuits and high topography.

It is still another object of this invention to enhance the reproducibility of the designed thickness of the resist over the surface of the substrate.

An additional object of this invention is to minimize the sensitivity of reproducibility of photoresist application to minor changes in either chemical, or physical or environmental conditions.

It is another object of this invention to first dispense the photoresist and distribute at one rotating speed of the vacuum chuck holding the wafer.

It is another object of this invention to leveling the photoresist at a second reduced rotating speed.

It is another object of this invention to dispense a second layer of photoresist over the first leveled layer of photoresist at a third high rotating speed.

It is still another object of this invention to level the second photoresist layer at a fourth reduced rotating speed.

Another preferred object of this invention is to reduce the manufacturing cost by minimizing the processing steps required to achieve the reproducible uniformity of photoresist over substrates with high density, high topography circuits.

It is another object of this invention to use a single photoresist dispense rotation speed and follow with various rotating speeds for leveling and stabling of the spin-on resist.

In accordance with the present invention, a method is described for application of photoresist onto the top surface of a substrate having high density circuit features using a multiple dispensing process of photoresists. A substrate having circuit patterns is cleaned and dehydrated and placed onto a rotating vacuum chuck. The substrate is then spun at high speed to remove surface particles. The photoresist is dispensed on the top surface of the substrate, while the substrate is rotating at a speed slower than the speed used to remove the particles. After the first layer of the photoresist is dispensed, the rotating speed is further decelerated to allow leveling of the deposited resist over the surface of the substrate. A second layer of photoresist is then dispensed, after the rotation of the substrate is accelerated to a very high speed. After a period of spinning at high speed, the rotation of the substrate is then decelerated a second time for additional leveling of the second photoresist layer. The resulting photoresist layer over the substrate is uniform without any striation to mar the alignment thus assures the critical design dimension of the subsequent photolithography uniformity.

In another embodiment of the present claimed invention, only a single dispensation of photoresist is used. Then the substrate wafer's rotation speed is reduced to level the deposited photoresist layer. This is followed by a high speed spin to level the resist further. Next, the rotation is decelerated for stabilization effect. This alternative method not only alleviates problems of mottling, and radial striations caused by the differences in the resist flow over high topographic features, but also cuts down the processing steps thus cost of manufacturing.

The foregoing and other features and advantages of this invention will become more apparent from the following detailed description which proceeds with reference to the accompanying drawings.

BRIEF DESCRIPTION OF THE DRAWINGS

FIGS. 1 and 2 are perspective views to illustrate the problems encountered on the substrate wafers coated with photoresist by the conventional Prior Art methods.

FIG. 3 shows schematically the cross-section of the photoresist striations appeared on a smooth substrate surface after the coating process.

FIG. 4 shows schematically the cross-section of the topographic substrate coated with photoresist.

FIG. 5 shows the results of improvement in striation height on the topographic substrates coated with methods described in this invention.

DETAILED DESCRIPTION OF THE PREFERRED EMBODIMENTS

Embodiments of the present will be described in the following with reference to the drawings.

A variety of technologies rely upon the precise, uniform deposition of a liquid coating material over a solid substrate. A typical example of these technologies that depends extensively on the attainment of a uniform coating of designed thickness over an uneven topographic surface is the semiconductor manufacturing industry, in which photoresist materials are deposited upon semiconductor wafers to define underlying areas which will be either etched or doped after the photoresist is exposed.

Conventional methods applying photoresist consist of placing a semiconductor wafer upon a vacuum chuck in a chamber. The liquid photoresist is dispensed over the center of the wafer while the wafer spins at a slow speed. Then the wafer is spun at a faster speed to distribute the photoresist from the center outwardly toward the edge of the wafer by the centrifugal force until the entire top surface of the wafer is coated. One of the major problems encountered by distributing the substrate wafer by the conventional methods is the appearance of radial striations of uneven resist thickness over the surface, 20, as shown in FIG. 1. This is most likely resulted from the combination effects of the centrifugal force, 21, of dispersing the liquid photoresist, the viscosity of the resist, the surface condition and the topography of the substrate and the edge condition of substrate. Other types of uneven thickness of resist coating over the surface such as shown in FIG. 2, 22, also appear due to spin-direction. The profile cross-section of these photoresist striations over a flat, smooth substrate surface after coating, 23, is shown in FIG. 3. The unevenness of the photoresist thickness over the high topography substrate surface, 24, shown in FIG. 4, tends to affect the critical dimension of the design pattern and causes alignment failure. The thin film standing wave effects between the top and bottom surfaces of the resist cause variation of critical dimension changes in the coupling of exposure light energy into the photoresist compound of the resist material.

The photoresist layer applied by the conventional method is invariably terminating in a boundary such as a scribed line in the bare silicon or along various heights of device features, in the shape of bulb, due to the high viscosity of the photoresist and the surface tension thus again resulting in mottling of the resist.

In one embodiment of the present invention, the substrate surfaces are dehydrated by heating in an oven or over a hot-plate at a temperature between about 140 to 160 deg. C. for about 60 to 70 seconds under air ambient. After the substrate has been cooled down to room temperature for about 60 seconds under air ambient, it is mounted onto a vacuum chuck which has a diameter smaller than that of the substrate, and the center of the substrate is aligned to the central axis of the vacuum chuck rotating platform. The substrate is then rotated at a high speed between about 4,000 to 5,000 rpm for about 1–5 seconds to remove any loose particles on the surface of the substrate. The substrate's rotational speed is then decelerated at a rate of approximately 1,000 to 10,000 rpm per second to a rotational speed of about 1,500 to 2,500 rpm. The liquid resist for the first layer is then dispensed at a constant rate in the range of 0.5 to 1.2 grams per sec., while the substrate's rotation speed is maintained at approximately 1,500 to 2,500 rpm. At the end of the first dispensation of the liquid resist, the rotation is further decelerated at a rate of about 1,000 to 5,000 rpm per second to a speed of about 1,000 to 1,500 for a duration of 3 to 8 seconds to level the first layer of the spun on resist. Accelerate the rotational speed at a rate of 1,000 to 10,000 rpm per second to about 3,000 to 5,000 rpm. A second layer of photoresist is dispensed at a rate between about 0.5 to 1.2 grams per second for about 3 to 8 seconds while the substrate's rotational speed is being maintained between 3,000 to 5,000 rpm. After the dispensation of the second layer of photoresist is completed, decelerate the substrate rotational speed at a rate of 1,000 to 10,000 rpm per second until the rotational speed reaches about 1,000 to 3,000 rpm. Maintaining the substrate rotational speed at that level for about 15 to 30 seconds for controlling the uniformity of the resist thickness and drying of the resist. At the conclusion of these resist application steps mentioned herewith, the edge beadings around the side and edge of the backside of the wafer are then removed and cleaned by using solvents, such as trichloroethylene and then rinsed in de-ionized water and dried. The substrate with the resist coatings is then soft baked at a temperature between 80 to 90 deg. C. for about 1–2 minutes under nitrogen ambient. By applying the resists in two separate steps and leveling each layer of resist separately after each application, the uniformity of the resist coating over the substrate has been improved reproducibly by almost 4 times over the resist coating applied by the prior art resist coating methods (FIG. 5).

Another method of the present claimed invention is by using a single dispensation method. Process the substrate as described above for the double-dispense method, that is, dehydrate the substrate at a temperature between 140 to 160 deg. C. in an oven or over a hot-plate under air ambient for about 60 to 70 seconds, cool the substrate to room temperature for about 1 to 2 minutes, mount the substrate to the vacuum chuck, align the center of the wafer to the center axis of the rotation vacuum chuck, and spin the substrate at speed between about 4,000 to 5,000 rpm for about 1 to 5 seconds to remove loose particles on the substrate surface. Decelerate the substrate rotation speed at a rate of 1,000 to 10,000 rpm per sec. to a spin speed of about 1,500 to 2,500 rpm. Dispense the resist at a rate between 0.5 to 1.2 gram per seconds for about 2 to 5 seconds. Decelerate the spin speed at the rate of 1,000 to 5,000 rpm per second to a spin speed of approximately in the range of 1,000 to 1,500 rpm and maintain at that speed for about 3 to 8 seconds to level the coated photoresist. Accelerate the substrate spin speed at a rate of 1,000 to 10,000 per second, until the rotational speed increases to about 3,000 to 5,000 rpm. Sustaining this rotational speed for about 3 to 8 seconds in order to control the thickness of the spun on photoresist. The rotational speed is then decelerated at a rate of 1,000 to 10,000 rpm per second until it reaches at a spin speed of about 1,000 to 3,000 rpm. Continue at this low rotational speed for about 15 to 30 seconds to further enhance the uniformity of the thickness of the coated resist over the substrate and simultaneously drying the photoresist. The substrate is then dismounted from the vacuum chuck. The photoresist beadings accumulated around edge and peripheral of the backside of the substrate are removed by solvents, such as, trichloroethylene, etc. The coated substrate is then soft baked at 80 to 100 deg.C. for about 1 to 2 minutes. This alternative method has an additional advantage of simplifying the resist application step which is cost-effective in the manufacturing of semiconductor industry, where photoresist is expensive and being used extensive in numerous lithographic steps to define device features and integrated circuits.

The above descriptions of specific embodiments of present inventions have been depicted for purpose of illustrations of the preferred embodiments thereof. They are not intended to limit the invention to the precise content disclosed. They will be understood by those skilled in the art that various changes in the form and details may be made without departing from the scope and spirit of this invention.

What is claimed is:

1. A method for applying a uniform coating on a semiconductor substrate with photoresist material comprising the steps of:

dehydrating the semiconductor substrate and cooling to room temperature;
   mounting said substrate onto a vacuum chuck with a flat horizontal platform that allows the substrate to rotate about a central axis;
   accelerating said substrate to a first rotational speed;
   decelerating said substrate to a second rotational speed;
   maintaining said substrate at the second rotational speed while simultaneously dispensing a first predetermined amount of photoresist at a predetermined rate onto the center of the top surface of said substrate during the second rotational speed;
   decelerating said substrate further from said second rotational speed to a third rotational speed of between about 1000 and 1500 rpm, to level the photoresist across the entire wafer surface, to reduce striation;
   accelerating said substrate to a fourth rotational speed;
   sustaining said substrate at said fourth rotational speed and concurrently dispensing a second pre-determined amount of photoresist at a designated rate onto the center of the surface of the substrate;
   decelerating said substrate to a fifth rotational speed of between about 1000 and 3000 rpm for leveling said second predetermined amount of photoresist across the entire wafer surface, to reduce striation;
   sustaining said substrate at the fifth rotational speed until such that said uniform second photoresist layer is dried;
   removing photoresist beads along the peripheral and edges of the backside of the substrate; and
   soft baking the substrate.

2. The method of claim 1, wherein said semiconductor substrate is pre-baked at temperatures between about 140 to 160 deg. C. for approximately 60 to 70 seconds.

3. The method of claim 1, wherein said substrate is first spun at a high speed approximately between 4,000 to 5,000 rpm for about 1 to 5 seconds.

4. The method of claim 1, wherein the rotational speed of said substrate is decelerated to a second rotational speed of about 1,500 to 2,500 rpm.

5. The method of claim 1, wherein the first predetermined amount of photoresist is dispensed at a rate of about 0.5 to 1.2 grams per second to the center of the top surface of the substrate, while the substrate is rotating at said second rotational speed for about 2 to 5 seconds.

6. The method of claim 1, wherein the first dispensed photoresist is leveled at a further decelerated rotational speed, the third rotational speed, for about 3 to 8 seconds.

7. The method of claim 1, wherein the second predetermined amount of photoresist is dispensed onto the center of the top surface of the substrate at a rate of approximately 0.5 to 1.2 grams per second, after the rotational speed of the substrate is accelerated to about 3,000 to 5,000 rpm, the fourth rotational speed.

8. The method of claim 1, wherein said substrate continues to rotate at said fourth rotational speed for 3 to 8 seconds.

9. The method of claim 1, wherein said substrate is dismounted from the vacuum chuck, and the photoresist beads around the edge and peripheral of the backside is removed and cleaned by solvents and then rinsed in de-ionized water.

10. The method of claim 1, wherein said substrate having the two coats of photoresist is soft baked at approximately between 80 to 90 deg. C. for about 60 to 70 seconds in nitrogen ambient.

11. A process for coating photoresist uniformly over the top surface of a substrate comprising the steps of:

dehydrating said substrate;
   cooling said substrate back to room temperature before mounting said substrate onto the flat horizontal platform attached to a vacuum rotating chuck, which allows the substrate to rotate around a central axis;
   accelerating said substrate to a first rotational speed and maintaining that speed until the substrate is stabilized with said first rotational speed;
   decelerating said substrate from the first speed to a second rotational speed;
   dispensing photoresist in a measured amount at a steady rate onto the center of the substrate, while the substrate is maintained at said second rotational speed;
   decelerating said substrate further from the second rotational speed to a third rotational speed of between about 1000 and 1500 rpm, to level the photoresist across the entire wafer surface, to reduce striation, and maintaining rotation at said speed;
   accelerating said substrate from said third speed to a fourth rotational speed;

decelerating said substrate from said fourth speed to a fifth rotational speed;

removing photoresist beads accumulated around the edge and the peripheries of the backside of the substrate, after the substrate is dismounted from said vacuum chuck;

cleaning said substrate; and soft-baking said substrate after cleaning.

12. The method of claim 11, wherein said substrate is dehydrated in an oven at a temperature in the range of 140 to 150 deg. C. for about 60 to 70 seconds.

13. The method of claim 11, wherein said substrate cooled to room temperature for at least 1 to 2 minutes before mounting on the vacuum chuck.

14. The method of claim 11, wherein said substrate is spun at said first rotational speed of approximately about 4000 to 5000 rpm for a duration of about 10 to 15 seconds.

15. The method of claim 11, wherein said substrate is decelerated from a first rotational speed to a second rotational speed of about 1,500 to 2,500 rpm.

16. The method of claim 11, wherein said photoresist is dispensed over the center of the top surface of the substrate at dispensation rate of about 0.5 to 1.2 grams of resist per second, while the substrate is rotating at said second rotational speed for about 2 to 5 seconds.

17. The method of claim 11, wherein said third rotating speed is maintained for a duration of 3 to 8 seconds.

18. The method of claim 11, wherein the rotating speed of said substrate is increased from said third rotational speed to a fourth rotational speed of approximately 3,000 to 5,000 rpm for a duration of 3 to 8 seconds.

19. The method of claim 11, wherein the rotational speed of said substrate is decreased from said fourth rotational speed to the fifth rotational speed of 1,000 to 3,000 rpm for 15 to 30 seconds for uniformity control and drying purposes.

20. The method of claim 11, wherein the photoresist beads accumulated along the edge and peripheral of said substrate are removed with solvents selected from the group consisting of tricholoroethylene and acetone, after the substrate is dismounted from the vacuum chuck.

21. The method of claim 11, wherein said substrate is soft baked in an oven at a temperature in the range of about 80 to 90 deg. C. for about 1 to 2 minutes.

* * * * *